US009255957B2

(12) United States Patent
Arima et al.

(10) Patent No.: US 9,255,957 B2
(45) Date of Patent: Feb. 9, 2016

(54) EARTH FAULT DETECTION CIRCUIT AND POWER SOURCE DEVICE

(71) Applicant: Hitachi Vehicle Energy, Ltd., Hitachinaka-shi, Ibaraki (JP)

(72) Inventors: Tomoyuki Arima, Hitachinaka (JP); Akihiko Kudo, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 188 days.

(21) Appl. No.: 13/961,402

(22) Filed: Aug. 7, 2013

(65) Prior Publication Data

US 2014/0049860 A1 Feb. 20, 2014

(30) Foreign Application Priority Data

Aug. 14, 2012 (JP) ................................. 2012-179889

(51) Int. Cl.
*H02H 3/16* (2006.01)
*G01R 31/02* (2006.01)

(52) U.S. Cl.
CPC ............. *G01R 31/025* (2013.01); *H02H 3/16* (2013.01)

(58) Field of Classification Search
USPC ......................................................... 361/42
See application file for complete search history.

(56) References Cited

U.S. PATENT DOCUMENTS 3,953,766 A * 4/1976 Howell et al. ................... 361/45
2012/0043967 A1* 2/2012 Miura et al. .................. 324/426

FOREIGN PATENT DOCUMENTS

JP    2001330643 A  * 11/2001
JP    2006-177840 A    7/2006
WO   2011/040128 A1   4/2011

* cited by examiner

*Primary Examiner* — Stephen W Jackson
*Assistant Examiner* — Ann Hoang
(74) *Attorney, Agent, or Firm* — Volpe and Koenig, P.C.

(57) ABSTRACT

An earth fault detection circuit for detecting an earth fault between a high-voltage battery and a motor includes: an A.C. signal generation portion generating an A.C. signal; a first capacitive element between the A.C. signal generation portion and one end side of the high-voltage battery; a voltage dividing circuit dividing a voltage on the one end side of the high-voltage battery; an earth fault detection portion detecting the earth fault between the high-voltage battery and the motor based on an earth fault detection signal inputted thereto; and a second capacitive element inputting an A.C. component of the voltage, on the one end side of the high-voltage battery, which is obtained by the voltage division in the voltage dividing circuit as the earth fault detection signal to the earth fault detection portion.

6 Claims, 6 Drawing Sheets

F I G . 4
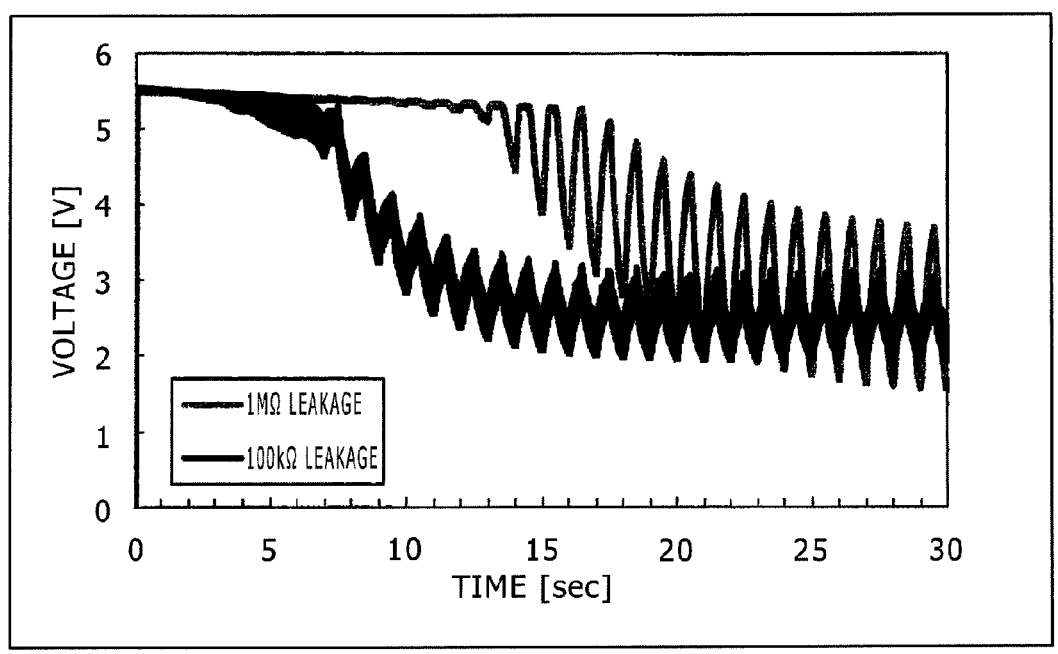

EARTH FAULT DETECTION CIRCUIT AND POWER SOURCE DEVICE

BACKGROUND OF THE INVENTION

1. Field of the Invention

The present invention relates to an earth fault detection circuit and a power source device including the same.

2. Description of the Related Art

In general, a power source device for controlling power source supply from a high-voltage battery to a load is connected to the high-voltage battery which is mounted in a vehicle such as an electric car, a fuel-cell car or a hybrid car. The power source device is insulated from a car body. Thus, in response to the risk of electrical shock becoming high when an earth fault occurs in the power source device, a circuit for detecting an earth fault in the power source device is proposed.

An inverter for drive-controlling a motor can be connected to the high-voltage power source as a load. In such a case, even when the earth fault in the high-voltage power source is to be detected, it becomes difficult to make a correct judgment about the earth fault since, under the influence of a noise which is generated from the inverter during the operation of the motor, the noise is superimposed on a detection signal. To cope with this, an earth fault detecting device is known as an earth fault judging means that takes the influence of such a noise into consideration. For example, JP-2006-177840-A describes such an earth fault detecting device, which includes an external noise removing circuit in which a high-frequency noise removing function can be turned ON/OFF by a switch circuit. Thus, the earth fault detecting device judges presence or absence of generation of the earth fault based on a response waveform appearing when a pulse signal is applied to one end side of a high-voltage power source through a coupling capacitor in a state in which the high-frequency noise removing function is held in an ON state.

SUMMARY OF THE INVENTION

In the earth fault detection device described in JP-2006-177840-A, a filter circuit which is composed of a resistor and a capacitor whose one end is grounded through the switch circuit is used as the external noise removing circuit, thereby realizing the high-frequency noise removing function. Therefore, since for the high-frequency noise, a situation becomes a state in which the earth fault is generated, the earth fault detection device described in JP-2006-177840-A is not suitable from a viewpoint of safety and power consumption.

In the light of the problems as described above in the related art, and it is therefore a principal object of the present invention to provide an earth fault detection circuit which is capable of suitably carrying out earth fault judgment in consideration of an influence of a noise generated from an inverter during an operation of a motor, and a power source device including the same.

According to an embodiment of the present invention, there is provided an earth fault detection circuit for detecting an earth fault between a high-voltage battery and a motor, the earth fault detection circuit including: an A.C. signal generation portion for generating an A.C. signal; a first capacitive element provided between the A.C. signal generation portion and one end side of the high-voltage battery; a voltage dividing circuit for dividing a voltage on the one end side of the high-voltage battery; an earth fault detection portion for detecting the earth fault between the high-voltage battery and the motor based on an earth fault detection signal inputted thereto; and a second capacitive element provided between the voltage dividing circuit and the earth fault detection portion, the second capacitive element being used for inputting to the earth fault detection portion as the earth fault detection signal an A.C. component of the voltage, on the one end side of the high-voltage battery, which is obtained by the voltage division in the voltage dividing circuit, in which the earth fault detection portion determines a level of a noise between the high-voltage battery and the motor based on a result of measurement of the earth fault detection signal made when the A.C. signal is not generated by the A.C. signal generation portion, and a result of measurement of the earth fault detection signal made when the A.C. signal is generated by the A.C. signal generation portion, thereby detecting the earth fault.

According to another embodiment of the present invention, there is provided a power source device including: the earth fault detection circuit in the embodiment described above; and a battery controller for managing the high-voltage battery as an assembled battery composed of plural battery cells.

As set forth hereinabove, according to the present invention, the earth fault can be suitably judged in consideration of the influence of the noise which is generated from the inverter during the operation of the motor.

BRIEF DESCRIPTION OF THE DRAWINGS

Other objects and advantages of the invention will become apparent from the following description of embodiments with reference to the accompanying drawings in which:

FIG. 4 is a waveform chart showing an example of a voltage waveform of an earth fault detection signal under an influence of an inverter noise in a conventional earth fault detection circuit;

DESCRIPTION OF THE PREFERRED EMBODIMENTS

Hereinafter, embodiments of the present invention will be described in detail with reference to the accompanying drawings.

(Configuration of Power Source Device)

Figure 1:
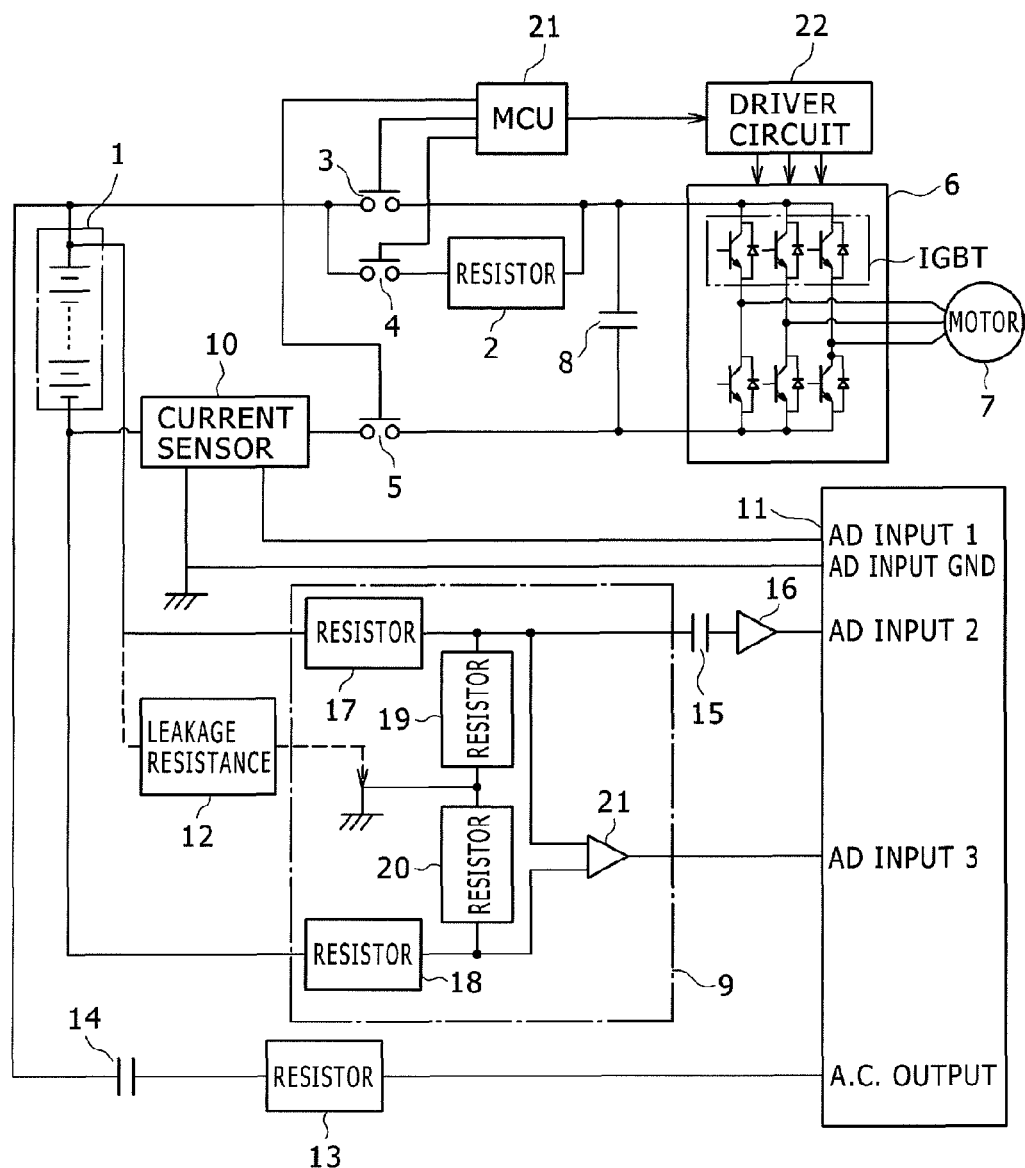
FIG. 1 is a circuit diagram showing a configuration of an earth fault detection circuit according to the embodiment of the present invention.

FIG. 1 is a circuit diagram showing a configuration of a power source device according to the embodiment of the present invention. A vehicle such as an electric car, a fuel-cell car or a hybrid car is loaded with the power source device shown in FIG. 1. Driving a motor 7 installed on the vehicle or collecting a regenerative electric power generated by the motor 7 involves charge/discharge control of a high-voltage battery 1 by the power source device.

The high-voltage battery 1 is insulated from a car body. The power source device according to the embodiment of the present invention includes an earth fault detection circuit. The earth fault detection circuit detects that insulation for the car body is deteriorated, and thus an earth fault is generated between the high-voltage battery 1 and the motor 7.

The power source device includes a precharge resistor 2, relays 3 to 5, an inverter 6, an MCU 21, a drive circuit 22, a capacitor 8, a total voltage detection circuit 9, a current sensor 10, a microprocessor 11, a resistor 13, a coupling capacitor 14 for input, a coupling capacitor 15 for detection, and an amplifier 16.

The high-voltage battery 1, for example, is composed of a lithium-ion battery. In this case, the high-voltage battery 1 is structured in such a way that plural cells each having a positive electrode made of a manganese based material, and having a negative electrode made of an amorphous carbon material are connected in series with one another. A rated capacity of the high-voltage battery 1, for example, is 5.5 Ah, and a rated voltage thereof, for example, is 3.6 V.

The high-voltage battery 1 and the inverter 6 are connected to each other through the relays 3 to 5. The relays 3 to 5 are controlled by the MCU 21 for controlling the inverter 6, and thus ON states and OFF states thereof are switched over to one another. A large-capacitance capacitor 8 for smoothing a pulse-like charge/discharge current is connected to an input terminal side of the inverter 6. The precharge resistor 2 for preventing an inrush current is provided between the high-voltage battery 1 and the inverter 6. The precharge resistor 2, for example, has a resistance value of 390Ω. At the time when a current is started to be caused to flow from the high-voltage battery 1 to the inverter 6, the relays 4 and 5 are both closed, whereby the high-voltage battery 1 and the inverter 6 are connected to each other through the precharge resistor 2. As a result, the inrush current which is caused to flow through the capacitor 8 is limited, and thus contact points of the relays 3 to 5 are protected. After that, the relay 3 is closed and the relay 4 is opened, whereby the high-voltage battery 1 and the inverter 6 are connected to each other without through the precharge resistor 2. In such a manner, a state of connection between the high-voltage battery 1 and the inverter 6 is switched by the relays 3 to 5.

The inverter 6 is connected to the motor 7 installed on the vehicle, and converts a D.C. electric power outputted from the high-voltage battery 1 into a three-phase A.C. electric power. Also, the inverter 6 outputs the resulting three-phase A.C. electric power to the motor 7, thereby driving the motor 7. In addition, the inverter 6 converts a regenerative electric power generated with the motor 7 as a power generator into a D.C. electric power. Also, the inverter 6 outputs the resulting D.C. electric power to the high-voltage battery 1, thereby charging the high-voltage battery 1 with the electricity from the resulting D.C. electric power. That is to say, the inverter 6 has bidirectional input/output characteristics and functions as a charge/discharge load for the high-voltage battery 1.

The total voltage detection circuit 9 detects a total voltage of the high-voltage battery 1, and outputs a voltage corresponding to a detection value of the total voltage as a voltage detection signal. The total voltage detection circuit 9 includes resistors 17 to 20 composing a voltage dividing circuit, and a differential amplifier 21. The voltage detection signal outputted from the total voltage detection circuit 9 is an output from the differential amplifier 21. A current sensor 10 detects a current which is inputted/outputted to/from the high-voltage battery 1, and outputs a voltage corresponding to a detection value of the current as a current detection signal. The current detection signal outputted from the current sensor 10, and the voltage detection signal outputted from the total voltage detection circuit 9 are inputted to AD input terminals 1 and 3 of the microprocessor 11, respectively.

A terminal on a high-voltage side of the high-voltage battery 1, that is, a terminal on a positive electrode side thereof is connected to an AD input terminal 2 of the microprocessor 11 through the resistor 17 within the total voltage detection circuit 9, the coupling capacitor 15 for detection, and the amplifier 16. The amplifier 16 detects voltage on the high-voltage side of the high-voltage battery 1, and outputs a voltage corresponding to a detection value of the voltage as an earth fault detection signal to the AD input terminal 2 of the microprocessor 11. In addition, the terminal on the high-voltage side of the high-voltage battery 1 is connected to one of two input terminals which the differential amplifier 21 has. A voltage which is inputted from the terminal on the high-voltage side of the high-voltage battery 1 to each of the coupling capacitor 15 for detection, and the differential amplifier 21 is divided by the resistors 17 and 19. Therefore, each of the coupling capacitor 15 for detection, and the differential amplifier 21 may also be low in withstanding voltage.

A terminal on a low-voltage side of the high-voltage battery 1, that is, on a negative electrode side thereof is connected to the other of the two input terminals which the differential amplifier 21 has. A voltage which is inputted from the terminal on the low-voltage side of the high-voltage battery 1 to the differential amplifier 21 is divided by the resistors 18 and 20.

The differential amplifier 21 compares the voltages which have been inputted to the two input terminals described above, respectively, with each other, and outputs a signal corresponding to a difference between the voltages as a voltage detection signal from the total voltage detection circuit 9 to the AD input terminal 3 of the microprocessor 11. The voltage detection signal represents a difference in voltage between the high-voltage side and the low-voltage side of the high-voltage battery 1, that is, a total voltage.

The microprocessor 11 is a battery controller for managing the entire power source device including the high-voltage battery 1. The microprocessor 11 has an oscillation circuit built therein. The oscillation circuit generates a predetermined A.C. signal, for example, a rectangular wave which has amplitude of 0 to 5 V, and a frequency of 10 Hz, and outputs the predetermined A.C. signal through an A.C. output terminal of the microprocessor 11. The A.C. output terminal of the microprocessor 11 is connected to the terminal on the high-voltage side of the high-voltage battery 1 through the resistor 13 and the coupling capacitor 14 for input.

The microprocessor 11 further has an AD converter built therein. The current detection signal from the current sensor 10, the earth fault detection signal from the amplifier 16, and the voltage detection signal from the total voltage detection circuit 9 are inputted to the AD converter of the microprocessor 11 through the AD input terminals 1 to 3, respectively. The AD converter measures these signals in a predetermined measurement range, for example, in a measurement range of 0 to 5 V, and converts these signals thus detected into digital values, respectively. The microprocessor 11 measures the total voltage, and the input and output currents in the high-voltage battery 1 based on the measured value after the digital conversion, and detects the earth fault, for the car body, between the high-voltage battery 1 and the motor 7.

(Explanation of Operation for Earth Fault Detection)

A voltage Vout expressed by Expression (1) is applied as the earth fault detection signal to the AD input terminal 2 of the microprocessor 11:

$$V_{out} \approx \alpha \times V_{in} \times (R1/(R1+R2+Z)) \quad (1)$$

where α is a value obtained by multiplying a ratio of voltage division made by the resistor 17 and the resistor 19 by an amplification factor of the amplifier 16, Vin is the voltage of the A.C. signal applied from the A.C. output terminal of the microprocessor 11 to the high-voltage side of the high-voltage battery 1, R1 is a resistance value of the leakage resistance 12, R2 is a resistance value of the resistor 13, and Z is an impedance of the coupling capacitor 14 for input.

When the leakage resistance 12 is generated, that is, when the earth fault is generated between the high-voltage battery 1 and the motor 7, amplitude of the earth fault detection signal which is inputted to the AD input terminal 2 of the microprocessor 11 is changed in accordance with Expression (1) described above. Therefore, the microprocessor 11 can detect the generation of the earth fault. In addition, when the coupling capacitor 15 for detection becomes an open state due to a failure or the like, since the earth fault detection signal different from that in the normal phase appears at the AD input terminal 2, just the same, the microprocessor 11 can detect the abnormality. Moreover, when the coupling capacitor 14 for input becomes an open state and thus no A.C. signal is applied to the high-voltage side of the high-voltage battery 1, since no A.C. component is contained in the earth fault detection signal appearing at the AD input terminal 2, just the same, the microprocessor 11 can detect the abnormality.

In the total voltage detection circuit 9, the voltage dividing circuit composed of the resistors 17 to 20 must have a sufficiently high resistance with respect to chassis GND when viewed from the side of the high-voltage battery 1. In addition, the voltage division ratios obtained based on a combination of the resistor 17 and the resistor 19, and the resistor 18 and the resistor 20 are set so as to agree with each other and so as to provide a voltage range within which the divided voltage can be normally amplified by the differential amplifier 21 even when one terminal of the high-voltage battery 11 is connected to chassis GND through the short-circuit.

The amplification factor of the amplifier 16 is set to an amplification factor with which reduction in the amplitude of the A.C. signal which is outputted from the microprocessor 11 is corrected, and the earth fault can be sufficiently detected from the earth fault detection signal with a resolution of the AD converter of the microprocessor 11. In addition, when a transition response generated in the phase of connection of the relays 3 to 5 is thereafter sufficiently stabilized and thus the earth fault can be sufficiently detected, the amplification factor is set in such a way that the voltage of the earth fault detection signal is not beyond an input voltage range of the AD converter of the microprocessor 11.

When the resistance value R1 of the leakage resistance 12 is zero in Expression (1), that is, when the high-voltage battery 1 perfectly undergoes the earth fault, Expression (1) is simplified into Expression (2):

$$V_{out} = 0 \quad (2)$$

Figure 2:
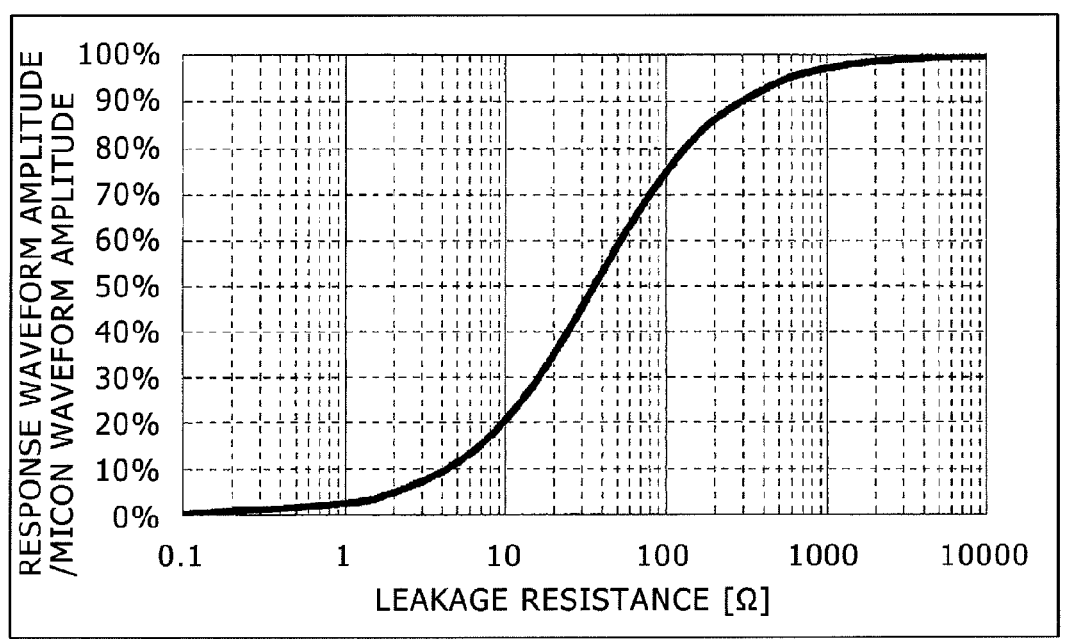
FIG. 2 is a graph showing a relationship between a ratio of Vin to Vout in Expression (1), and a leakage resistance.

FIG. 2 is a graph showing a relationship between a ratio of Vin to Vout, and the leakage resistance. In the present invention, an insulating resistance value can be monitored in the entire range of the voltage applied so as to have Vin, and it is possible to enhance the measurement precision of the insulating resistance.

Figure 3:
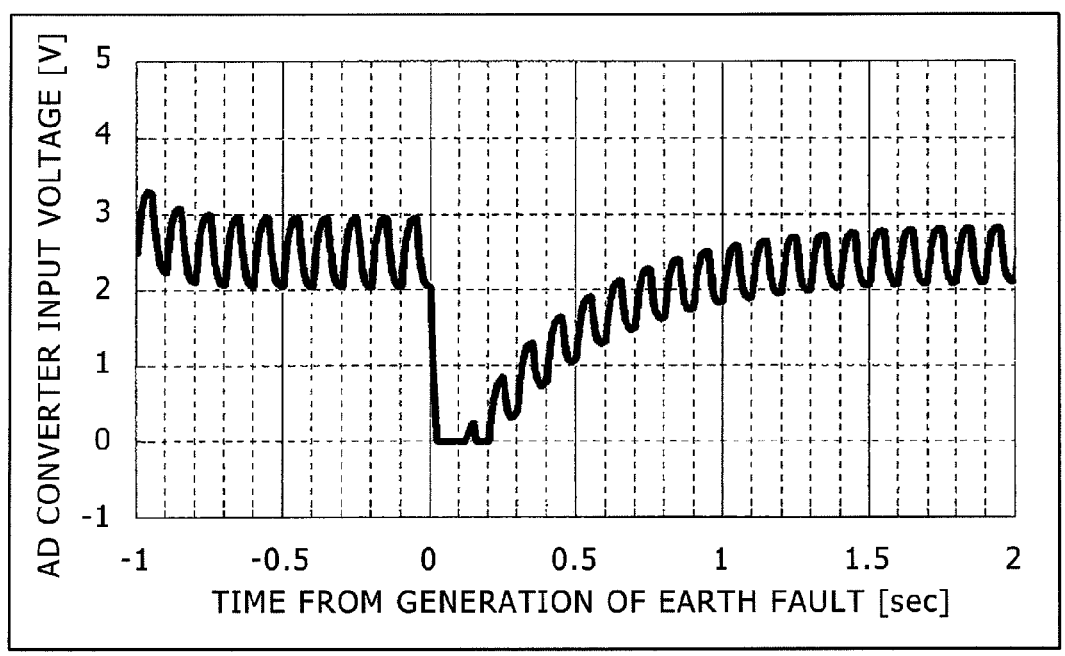
FIG. 3 is a waveform chart showing an example of a waveform of a voltage which is applied to a specific AD input terminal of a microprocessor when a positive terminal of a high-voltage battery undergoes an earth fault.

FIG. 3 is a waveform chart showing an example of a waveform of a voltage of the earth fault detection signal which is applied to the AD input terminal 2 of the microprocessor 11 when the earth fault is generated between the positive electrode side of the high-voltage battery 1, and the motor 7. When an input voltage range of the AD converter in the microprocessor 11 is set in the range of 0 to 5 V, Vout becomes beyond the input voltage range of the AD converter due to the voltage fluctuation which is generated when the earth fault is generated in some cases. In the present invention, by adjusting the amplitude, the amplitude is monitored just after generation of the earth fault, thereby making it possible to minimize delay of the earth fault detection operation.

When having detected the generation of the earth fault, the microprocessor 11 may interrupt the high-voltage battery 1 from both of the inverter 6 and the motor 7 by opening the relays 3 to 5. Alternatively, the microprocessor 11 which has detected the generation of the earth fault may carry out any other suitable operation other than the operation for opening the relays 3 to 5. For example, a warning light which is previously prepared may be lighted, thereby informing a user of the generation of the earth fault. These operations or other various kinds of operations may be combined with one another.

The earth fault generated between the high-voltage battery 1 and the motor 7 is detected by carrying out the earth fault detection operation as has been described so far. That is to say, the earth detection circuit according to the embodiment of the present invention is composed of the oscillation circuit and the AD converter which are built in the microprocessor 11, the coupling capacitor 14 for input which is provided between the A.C. output terminal of the microprocessor 11, and the positive electrode terminal side of the high-voltage battery 1, the resistor 17 and the resistor 19 composing the voltage dividing circuit for dividing the voltage developed on the positive electrode terminal side of the high-voltage battery 1, the coupling capacitor 15 for detection, and the amplifier 16 which are provided between the voltage dividing circuit, and the microprocessor 11.

(Influence of Inverter Noise)

While the earth fault generated between the high-voltage battery 1 and the motor 7 is detected in the manner as described above, a noise (inverter noise) which is generated due to the switching operation or the like when the inverter 6 converts the D.C. electric power into the three-phase A.C. electric power is superimposed on the earth fault detection signal. FIG. 4 is a waveform chart showing an example of a waveform of a voltage of an earth fault detection signal under an influence of an inverter noise in a conventional earth fault detection circuit. In this example of the voltage waveform, a waveform observed when no earth fault is generated is shown as "1 MΩ LEAKAGE", while a waveform observed when earth fault is generated is shown as "100 kΩ LEAKAGE". As can be seen from the example of the waveform shown in FIG. 4, under the influence of the inverter noise, the inverter noise corresponding to the switching frequency or the like of the inverter 6 is superimposed on the earth fault detection signal. The inverter noise is generated beyond the input voltage range of the AD converter of the microprocessor 11 in some cases. For this reason, in the conventional earth detection circuit, unless an operation state is the state in which the influence of the inverter noise is small, the earth fault generated between the high-voltage battery 1 and the motor 7 cannot be detected in some cases.

In the earth fault detection circuit according to the embodiment of the present invention, the resistance values of the resistor 17 and the resistor 19 composing the voltage dividing circuit are respectively determined in accordance with the predetermined voltage division ratio. The voltage division ratio is set to a value such that the amplitude of the earth fault detection signal when the inverter noise is superimposed on the earth fault detection signal is suitable suppressed and thus the voltage of the earth fault detection signal falls within the input voltage range of the AD converter of the microprocessor 11. As a result, the earth fault can be detected even under the influence of the inverter noise.

Figure 5:
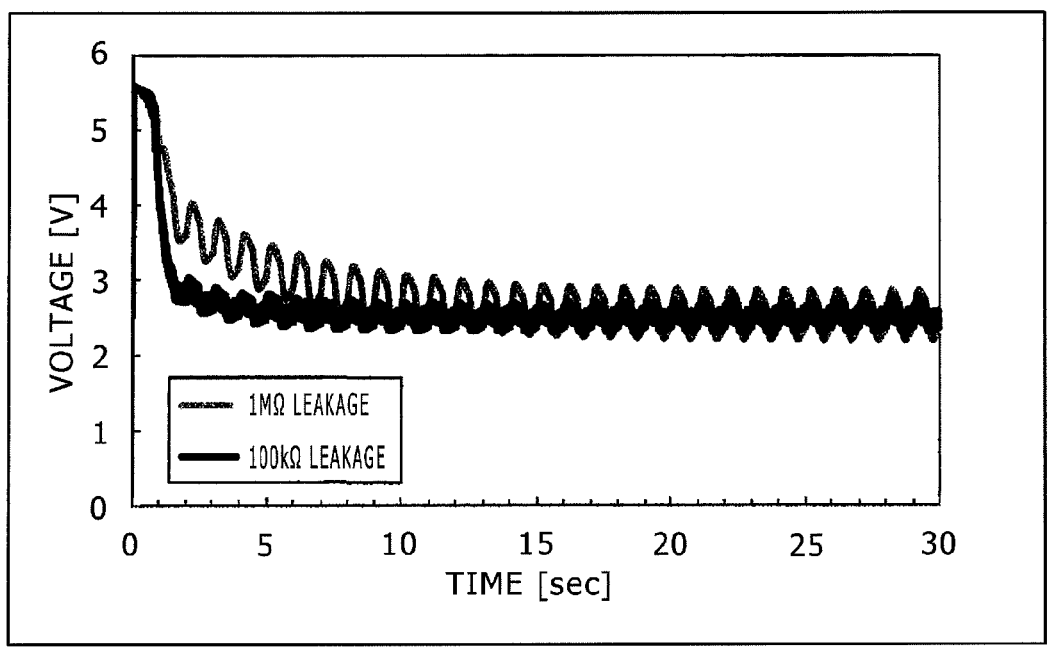
FIG. 5 is a waveform chart showing an example of a waveform of a voltage of an earth fault detection signal under an influence of an inverter noise in an earth fault detection circuit according to the present invention.

FIG. 5 is a waveform chart showing an example of a waveform of the earth fault detection signal under the influence of the inverter noise in the earth fault detection circuit according to the embodiment of the present invention. In the example as well of the voltage waveform, similarly to the case of the example of the voltage waveform FIG. 4, a waveform observed when no earth fault is generated is shown as "1 MΩ LEAKAGE", while a waveform observed when earth fault is generated is shown as "100 kΩ LEAKAGE". As can be seen from the example of the voltage waveform shown in FIG. 5, with the earth fault detection circuit according to the embodiment of the present invention, the inverter noise is sufficiently suppressed and can be kept within the input voltage range of the AD converter of the microprocessor 11.

(Operation for Earth Fault Detection in which Influence of Inverter Noise is Taken into Consideration)

In addition, with the earth fault detection circuit according to the embodiment of the present invention, the result of the measurement of the earth fault detection signal made when no A.C. signal (rectangular wave) is outputted from the A.C. output terminal of the microprocessor 11, and the result of the measurement of the earth fault detection signal made when the A.C. signal (rectangular wave) is outputted from the A.C. output terminal of the microprocessor 11 are compared with each other, thereby making it possible to determine the level of the inverter noise which is superimposed on the earth fault detection signal.

Figure 6:
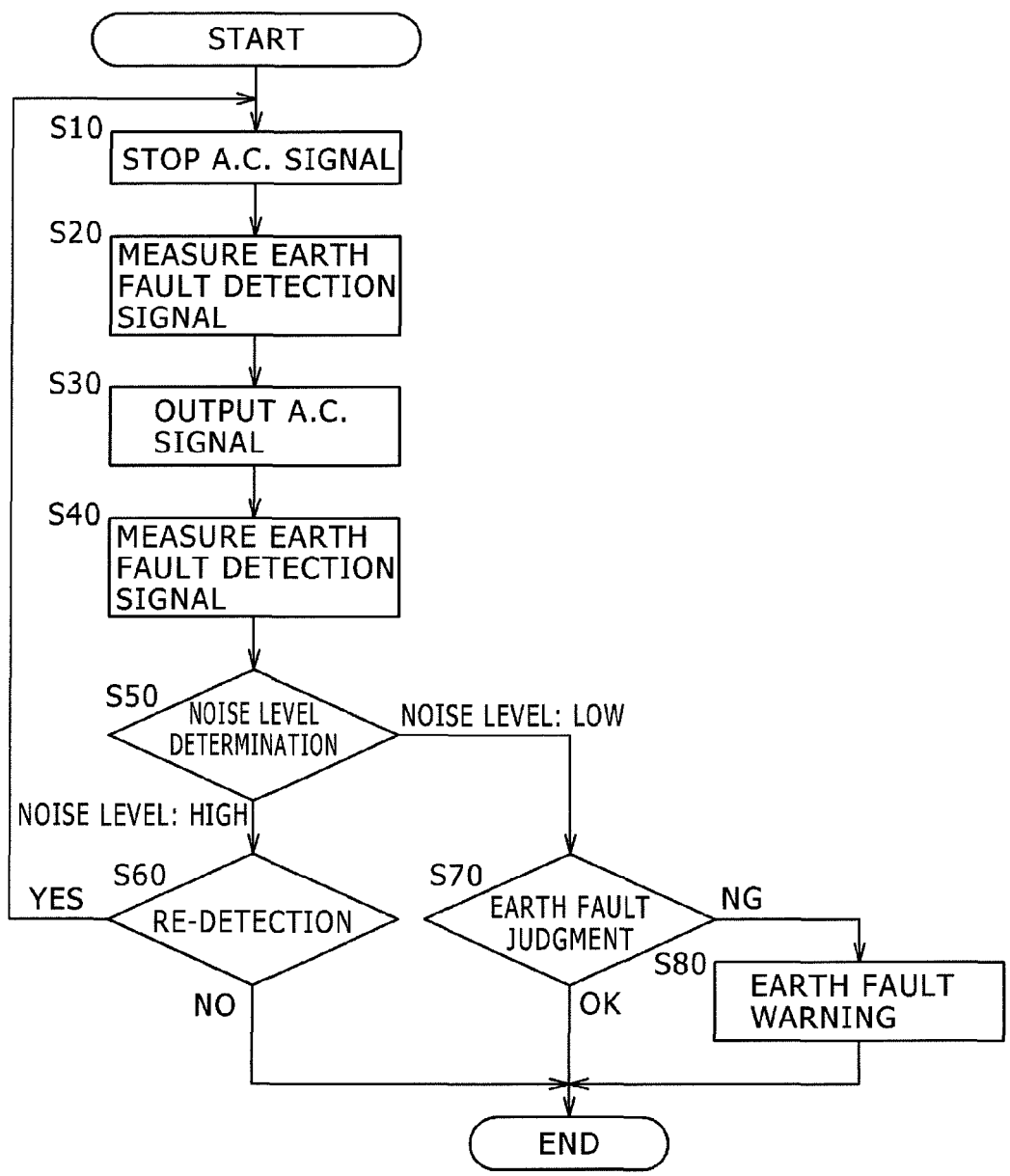
FIG. 6 is a flow chart explaining an operation having predetermined pieces of processing which are executed by the microprocessor when a level of the inverter noise is determined, thereby detecting an earth fault.

FIG. 6 is a flow chart explaining an operation having predetermined pieces of processing which are executed by the microprocessor 11 when the level of the inverter noise is determined, thereby detecting the earth fault.

The microprocessor 11 stops an operation for outputting the A.C. signal from the A.C. output terminal in processing in Step S10, and measures the earth fault detection signal at this time in processing in Step S20. After that, the microprocessor 11 outputs the A.C. signal from the A.C. output terminal in processing in Step S30, and measures the earth fault detection signal at this time in processing in Step S40. As a result, the microprocessor 11 acquires both of the result of the measurement of the earth fault detection signal made when no A.C. signal is generated, and the result of the measurement of the earth fault detection signal made when the A.C. signal is generated.

In processing in Step S50, the microprocessor 11 determines the level of the inverter noise between the high-voltage battery 1 and the motor 7 in accordance with the results of the measurements of the earth fault detection signals which have been acquired in the processing in Step S20 and the processing in Step S40, respectively. The result of the measurement of the earth fault detection signal acquired in the processing in Step S20 when no A.C. signal is generated, and the result of the measurement of the earth fault detection signal acquired in the processing in Step S40 when the A.C. signal is generated are compared with each other and as a result, that determination is carried out in accordance with the comparison result. For example, the measurement result in the processing in Step S20, and the measurement result in the processing in Step S40 are compared with each other, thereby calculating each other's amplitude difference. When each other's amplitude difference falls within a predetermined range, the noise level can be determined to be low. On the other hand, when each other's amplitude difference is beyond the predetermined range, the noise level can be determined to be high. It is noted that the measurement results may be compared with each other by using any other suitable method other than that method, thereby determining the noise level. As a result, when the noise level is determined to be high, the operation proceeds to processing in Step S60. On the other hand, when the noise level is determined to be low, the operation proceeds to processing in Step S70.

In the processing in Step S60, the microprocessor 11 judges whether or not the execution of re-detection is necessary. When a predetermined condition of re-detection is met, the microprocessor 11 judges that the re-detection is carried out, and the operation returns back to the processing in Step S10. In this case, the detection of the earth fault by the earth detection circuit is postponed to a next processing opportunity. On the other hand, when the microprocessor 11 judges that no re-detection is carried out because no condition of re-detection is met, the microprocessor 11 ends the operation shown in the flow chart of FIG. 6. In this case, the detection of the earth fault by the earth detection circuit is stopped. It is noted that the condition of re-detection, for example, can be determined in accordance with the number of times by which the noise level has been judged in the past in the processing in Step S50, the elapsed time from a time point at which the operation shown in the flow chart of FIG. 6 was started, and the like.

In the processing in Step S70, the microprocessor 11 carries out the judgment about the earth fault. In this case, presence or absence of the earth fault is judged by using the method as described above in accordance with the result of the measurement of the earth fault detection signal made when the A.C. signal acquired in the processing in Step S40 is generated. When the judgment result proves to be OK, that is, when it is judged that the earth fault is absent, the operation shown in the flow chart of FIG. 6 is ended. On the other hand, when the judgment result proves to be NG, that is, when it is judged that the earth fault is present, the operation proceeds to processing in Step S80.

In the processing in Step S80, the microprocessor 11 carries out a warning operation by the lighting of the warning light, or the like. In addition, at this time, the relays 3 to 5 may be opened in the manner as described above, thereby interrupting the high-voltage battery 1 from both of the inverter 6 and the motor 7. After the processing in Step S80 is executed, the operation shown in the flow chart of FIG. 6 is ended.

According to the embodiment of the present invention which have been described so far, the following operation and effects are offered.

(1) The earth fault detection circuit for detecting the earth fault between the high-voltage battery 1 and the motor 7 generates the A.C. signal by the oscillation circuit built in the microprocessor 11. The A.C. signal is inputted to the positive electrode terminal side of the high-voltage battery 1 through the coupling capacitor 14 for input which is provided between the A.C. output terminal of the microprocessor 11, and the positive electrode terminal side of the high-voltage battery 1. The voltage developed on the positive electrode terminal side of the high-voltage battery 1 is divided by the voltage dividing circuit composed of the resistor 17 and the resistor 19. Also, the A.C. component of the resulting voltage is inputted as the earth fault detection signal to the AD input terminal 2 of the microprocessor 11 through the coupling capacitor 15 for detection which is provided between the voltage dividing circuit, and the AD input terminal 2 of the microprocessor 11. The microprocessor 11 acquires both of the result of the measurement of the earth fault detection signal made when no A.C. signal is generated by the oscillator circuit (processing in Step S20), and the result of the measurement of the earth fault detection signal made when the A.C. signal is generated by the oscillator circuit (processing in Step S40) by using the AD converter built therein. Also, the microprocessor 11 determines the level of the noise between the high-voltage battery 1 and the motor 7 (processing in Step S50) in accordance with those measurement results, thereby detecting the earth fault (processing in Step S70). Since such a procedure is adopted, the judgment about the earth fault can be suitably carried out in consideration of the influence of the noise which is generated from the inverter 6 during the operation of the motor 7.

(2) The microprocessor 11 compares the result of the measurement of the earth fault detection signal acquired in the processing in Step 20 when no A.C. signal is generated by the oscillator circuit, with the result of the measurement of the earth fault detection signal acquired in the processing in Step 40 when the A.C. signal is generated by the oscillator circuit with each other. Also, the microprocessor 11 determines the level of the noise between the high-voltage battery 1 and the motor 7 in accordance with the comparison result. Since such a procedure is adopted, the noise level can be suitably judged in accordance with the result of the measurement of the earth fault detection signal.

(3) When the microprocessor 11 determines that the noise level is low in the processing in Step S50, the microprocessor 11 judges presence or absence of the earth fault in the processing in Step S70 in accordance with the result of the measurement of the earth fault detection signal made when the A.C. signal acquired in the processing in Step S40 is generated by the oscillator circuit. On the other hand, when the microprocessor 11 determines that the noise level is high in the processing in Step S50, the microprocessor 11 either postpones or stops the detection of the earth fault in accordance with the result of the judgment about the re-detection in the processing in Step S60. Since such a procedure is adopted, the judgment about the earth fault can be carried out at the suitable timing in consideration of the influence of the inverter noise.

(4) The inverter 6 for driving the motor 7 is connected between the high-voltage battery 1 and the motor 7. The resistance values of the resistor 17 and the resistor 19 composing the voltage dividing circuit are set in such a way that the voltage of the earth fault detection signal when the noise from the inverter 6 is superimposed thereon falls within the predetermined voltage range. As a result, since the amplitude of the earth fault detection signal when the noise is superimposed thereon can be suitably suppressed so as to fall within the input voltage range of the AD converter of the microprocessor 11, the earth fault can be detected even under the influence of the inverter noise.

(5) Since the voltage of the high-voltage battery 1 is detected by using the voltage dividing circuit composed of the resistor 17 and the resistor 19 in the total voltage detection circuit 9, it is possible to minimize the number of elements which are added to the circuit in order to detect the voltage of the high-voltage battery 1.

(6) The power source device includes the earth fault detection circuit described above, the microprocessor 11 serving as the battery controller for managing the high-voltage battery 1 provided in the form of the assembled battery composed of plural battery cells, and the relays 3 to 5 for switching the state of the connection between the high-voltage battery 1 and the inverter 6 as the load which is driven by the high-voltage battery 1. In the power source device, the microprocessor 11 can carry out the interruption between the high-voltage battery 1 and the inverter 6 by controlling the relays 3 to 5 in response to that the earth fault has been detected. By adopting such a configuration, it is possible to avoid the abnormal operation or the like of the inverter 6 when the earth fault is generated.

The following modifications are also within the scope of the present invention, and thus one or plural modifications can be combined with the embodiment described above.

(Modification 1)

By executing fast Fourier transform (FFT) for the result of the measurement of the earth fault detection signal, the inverter noise component which is superimposed on the earth fault detection signals may be calculated. In this case, in the processing in Step S50 shown in FIG. 6, the noise level can be determined from the magnitude of the inverter noise component thus calculated.

(Modification 2)

The present invention can be applied to a system using a rechargeable battery other than a lithium-ion battery, the system using none of the inverter and the motor, for example, a system other than the electric car, and the like.

(Modification 3)

The output from the amplifier 16 may also be inputted to a circuit and a device (or a unit) other than the microprocessor 11. In addition, the circuit and the device (or the unit) other than the microprocessor 11 may carry out the operation corresponding to the detection of the generation of the earth fault. For example, the power source device may be configured in such a way that the inverter 6 carries out the operation for opening the relays 3 to 5.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An earth fault detection circuit for detecting an earth fault between a high-voltage battery and a motor, said earth fault detection circuit comprising:

an A.C. signal generation portion for generating an A.C. signal;

a first capacitive element provided between said A.C. signal generation portion and one end side of said high-voltage battery;

a voltage dividing circuit for dividing a voltage on said one end side of said high-voltage battery;

an earth fault detection portion for detecting the earth fault between said high-voltage battery and said motor based on an earth fault detection signal inputted thereto; and a second capacitive element provided between said voltage dividing circuit and said earth fault detection portion, the second capacitive element being used for inputting to said earth fault detection portion as the earth fault detection signal an A.C. component of the voltage, on the one end side of said high-voltage battery, which is obtained by the voltage division in said voltage dividing circuit, wherein said earth fault detection portion determines a level of a noise between said high-voltage battery and said motor based on a result of measurement of the earth fault detection signal made when the A.C. signal is not generated by said A.C. signal generation portion, and a result of measurement of the earth fault detection signal made when the A.C. signal is generated by said A.C. signal generation portion, thereby detecting the earth fault, and wherein said earth fault detection portion compares a result of measurement of the earth fault detection signal made when no A.C. signal is generated by said A.C. signal generation portion, with a result of measurement of the earth fault detection signal made when the A.C. signal is generated by said A.C. signal generation portion, and determines the level of a noise between said high-voltage battery and said motor based on the comparison result.

2. The earth fault detection circuit according to claim 1, wherein when said earth fault detection portion judges that the noise level is low when a predetermined comparison result is within a predetermined range, said earth fault detection portion judges presence or absence of the earth fault based on the result of the measurement of the earth fault detection signal made when the A.C. signal is generated by said A.C. signal generation portion; and when said earth fault detection portion judges that the noise level is high when a predetermined comparison result is beyond the predetermined range, said earth fault detection portion postpones or stops detecting of the earth fault.

3. The earth fault detection circuit according to claim 1, further comprising: an inverter for driving said motor which is connected between said high-voltage battery and said motor, and wherein resistance values of resistors composing said voltage dividing circuit are set in such a way that the voltage of the earth fault detection signal provided when a noise from said inverter between said high-voltage battery and said motor is superimposed on the earth fault detection signal falls within a predetermined voltage range.

4. The earth fault detection circuit according to claim 1, further comprising: a total voltage detection circuit for detecting voltage of said high-voltage battery by using said voltage dividing circuit.

5. A power source device, comprising:
the earth fault detection circuit according to claim 1; and
a battery controller for managing said high-voltage battery as an assembled battery composed of plural battery cells.

6. The power source device according to claim 5, further comprising: a relay for switching a state of connection between said high-voltage battery, and a load driven by said high-voltage battery, wherein said battery controller carries out interruption between said high-voltage battery and said load by controlling said relay in response to the earth fault being detected by said earth fault detection portion.

* * * * *